United States Patent [19]

Nomura et al.

[11] Patent Number: 5,004,561
[45] Date of Patent: Apr. 2, 1991

[54] ELECTROMAGNETIC WAVE-SHIELDING THERMOPLASTIC RESIN COMPOSITION

[75] Inventors: Isao Nomura; Kenichi Narita, both of Hiratsuka, Japan

[73] Assignee: Mitsubishi Gas Chemical Company, Inc., Tokyo, Japan

[21] Appl. No.: 300,210

[22] Filed: Jan. 23, 1989

Related U.S. Application Data

[63] Continuation of Ser. No. 6/948,141, Dec. 29, 1986, abandoned.

[30] Foreign Application Priority Data

| Mar. 31, 1986 | [JP] | Japan | 61-71052 |
| Mar. 31, 1986 | [JP] | Japan | 61-71053 |
| Sep. 9, 1986 | [JP] | Japan | 61-210681 |
| Sep. 9, 1986 | [JP] | Japan | 61-210682 |
| Sep. 9, 1986 | [JP] | Japan | 61-210683 |
| Sep. 9, 1986 | [JP] | Japan | 61-210684 |
| Sep. 9, 1986 | [JP] | Japan | 61-210685 |

[51] Int. Cl.$^5$ .............................................. H01B 1/06
[52] U.S. Cl. ............................ 252/511; 252/506; 252/502; 252/518; 523/137; 524/495; 524/496
[58] Field of Search ............... 523/137; 252/518, 511, 252/506, 502, 508, 503; 524/495, 496, 401, 538, 602; 525/420, 432

[56] References Cited

U.S. PATENT DOCUMENTS

| 4,197,218 | 4/1980 | McKaveney | 252/506 |
| 4,305,847 | 12/1981 | Stoetzer et al. | 252/511 |
| 4,367,306 | 1/1983 | Maeda et al. | 523/137 |
| 4,474,685 | 10/1984 | Annis | 252/506 |
| 4,496,475 | 1/1985 | Abrams | 252/511 |
| 4,528,213 | 7/1985 | Nelson et al. | 252/511 |
| 4,559,164 | 12/1985 | Kostelnik et al. | 252/511 |
| 4,562,221 | 12/1985 | Shigemitsu | 525/183 |
| 4,569,786 | 2/1986 | Deguchi | 252/511 |
| 4,702,859 | 10/1987 | Shimizu et al. | 252/511 |
| 4,704,413 | 11/1987 | Nabeta et al. | 523/137 |
| 4,715,989 | 12/1987 | Sullivan | 252/518 |

FOREIGN PATENT DOCUMENTS

| 61-16942 | 1/1986 | Japan . |
| 61-16957 | 1/1986 | Japan . |

*Primary Examiner*—Josephine Barr
*Attorney, Agent, or Firm*—Wenderoth, Lind & Ponack

[57] ABSTRACT

An electromagnetic wave-shielding thermoplastic resin composition comprising
(A) 100 parts by weight of a thermoplastic resin selected from the group consisting of polypropylene resins, polystyrene resins, acrylonitrile/styrene/butadiene copolymer resin, polybutylene terephthalate resins, polyphenylene ether resins and linear aliphatic polyamide resins,
(B) 30 to 300 parts by weight of electrically conductive glass fibers,
(C) 5 to 40 parts by weight of carbon black, and
(D) 5 to 40 parts by weight of graphite.

9 Claims, No Drawings

ELECTROMAGNETIC WAVE-SHIELDING THERMOPLASTIC RESIN COMPOSITION

This application is a continuance of now abandoned Ser. No. 06/948,141 filed Dec. 29, 1986 now abandoned.

This invention relates to an electromagnetic wave-shielding thermoplastic resin composition having a high effect of shielding electromagnetic waves.

With the recent advance in electronic devices, a problem has arisen in relation to an electromagnetic environment around these electronic devices. This is presumably because the number of devices equipped with a microcomputer or the like has increased because of the advance in the large-scale integrated circuit technology, and casings of the electronic devices have been made of plastics because of their mass-producibility, economy and light weight so that the electromagnetic environment in which the electronic devices are placed has diversified. These electronic devices (computers, office machines, household electrical appliances, etc.) have reduced signal levels as a result of high integration, and are accordingly susceptible to the influences of noises.

On the other hand, elements or electronic circuits within these devices have an oscillating function, and issue noises outside and cause electromagnetic disorders. To solve this problem, it may be possible to improve the electronic circuits such that they are free from the effects of noises. In any case, it is necessary to impart an electromagnetic wave-shielding effect to casings that surround these electronic devices.

There are roughly two methods of imparting the electromagnetic wave shielding function to synthetic resins from which the casings are made, one involving coating an electrically conductive film on the surface of fabricated plastic casings by plating, painting, flame-spraying, foil bonding, etc., and the other involving making a composite material by incorporating an electrically conductive filler material into a plastic material.

According to the former method, the conductive film is likely to be exfoliated and drop off by the impact of falling, changes with time, thermal shocks, etc. This naturally results in a reduction in the electromagnetic wave-shielding effect. Moreover, the exfoliated fragments of the conductive film fall onto the electronic circuits, and might cause an accident such as damage to the devices, electric shock or fire.

According to the latter method, graphite, carbon black, carbon fibers, silver powder, copper powder, nickel powder, stainless steel powder, stainless steel fibers, aluminum flakes, aluminum ribbons, aluminum fibers, brass fibers, aluminum-coated glass fibers and nickel-coated glass fibers have been studied as the electrically conductive filler. If such an electrically conductive filler is increased to an extent of obtaining a sufficient electromagnetic wave-shielding effect, the mechanical strength of the resulting plastic article is frequently reduced. Also, it is not easy to mix it uniformly with a synthetic resin to impart a sufficient electromagnetic wave-shielding effect.

Fibers of stainless steel, brass or copper which will become effective in small amounts of mixing have mainly been studied recently. However, a resin composition comprising such metallic fibers has the defect that there are variations in resistance in molded articles prepared from the composition because of the orientation of the fibers that occurs during the molding, and moreover, the moldability of such a composition is poor.

It is an object of this invention to provide an electromagnetic wave-shielding thermoplastic resin composition having a novel composition and a high electromagnetic wave-shielding effect.

Another object of this invention is to provide a thermoplasic resin composition having a high electromagnetic wave-shielding effect over a broad frequency region.

Still another object of this invention is to provide a thermoplastic resin composition having a high electromagnetic wave-shielding effect and excellent mechanical strength.

Yet another object of this invention is to provide an electromagnetic wave-shielding thermoplastic resin composition which can be molded without difficulty.

Further objects and advantages of this invention will become apparent from the following description.

According to this invention, the above objects and advantages of this invention are achieved by an electromagnetic wave-shielding thermoplastic resin composition comprising (A) 100 parts by weight of a thermoplastic resin selected from the group consisting of polypropylene resins, polystyrene resins, acrylonitrile/styrene/butadiene copolymer resin, polybutylene terephthalate resins, polyphenylene ether resins and linear aliphatic polyamide resins, (B) 30 to 300 parts by weight of electrically conductive glass fibers, (C) 5 to 40 parts by weight of carbon black, and (D) 5 to 40 parts by weight of graphite.

The electromagnetic wave-shielding thermoplastic resin composition of this invention contains the specific thermoplastic resin (A).

The polypropylene resins may include a homopolymer of propylene and copolymers of propylene with other alpha-olefins. The copolymers include random copolymers and block copolymers.

Preferred propylene copolymers are composed of at least 90 mole % of propylene units and not more than 10 mole % of units of another alpha-olefin. Preferred examples of the other alpha-olefins are alpha-olefins having 2 to 8 carbon atoms such as ethylene, butene-1, pentene-1, 3-methylpentene-1 and 4-methylpentene-1. These alpha-olefins may be used in combination.

The polystyrene resins may include a homopolymer of styrene and random copolymers of styrene and other copolymerizable monomers. Examples of the other copolymerizable monomers are styrene-type monomers such as alpha-methylstyrene and chlorostyrene. The proportion of units derived from such other copolymerizable monomers is preferably 5 to 10 mole % in the copolymers.

Further examples of the polystyrene resins include impact-resistant polystyrenes obtained by graft-polymerizing styrene-type monomers such as styrene, alpha-methylstyrene and chlorostyrene with diene-type rubber elastomers such as polybutadiene.

The above polystyrene resins may be used singly or in combination.

A resin generally called ABS resin composed of, for example, 25 to 30% by weight of acrylonitrile units, 25 to 30% by weight of butadiene units and the balance (the total being 100% by weight) being styrene units is preferably used as the acrylonitrile/styrene/butadiene copolymer resin.

The polybutylene terephthalate resins include polybutylene terephthalate and copolymers preferably composed of at least 60 mole % of butylene terephthalate units and not more than 40 mole % of comonomer units. The comonomer units are derived from an aliphatic, alicyclic or aromatic diol component such as ethylene glycol, propylene glycol, decamethylene glycol, neopentyl glycol, gamma-xylylene glycol, cyclohexanediol or cyclohexane dimethanol and an aromatic, alicyclic or aliphatic dicarboxylic acid component such as isophthalic acid, phthalic acid, terephthalic acid, p-hydroxybenzoic acid, m-hydroxybenzoic acid, naphthalenedicarboxylic acid, oxalic acid, adipic acid, sebacic acid or cyclohexanedicarboxylic acid.

The polyphenylene ether resins include a homo- or co-polymer of phenylene ether, and a grafted poly-phenylene ether polymer obtained by grafting an aromatic vinyl compound to such a homo- or co-polymer.

Preferably, the homopolymer or copolymer of polyphenylene ether is obtained by polycondensing a monocyclic phenol represented by the following formula

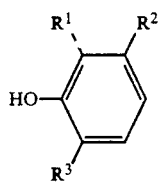

wherein $R^1$ represents a lower alkyl group having 1 to 3 carbon atoms, and $R^2$ and $R^3$, independently from each other, represent a hydrogen atom or an alkyl group having 1 to 3 carbon atoms.

The homopolymer can be obtained from a single monocyclic phenol, and the copolymer, from two or more monocyclic phenols.

The alkyl group having 1 to 3 carbon atoms in general formula (I) denotes methyl, ethyl, n-propyl and iso-propyl groups.

Examples of the monocyclic phenol of general formula (I) include 2,6-dimethylphenol, 2,6-diethylphenol, 2,6-dipropylphenol, 2-methyl-6-ethylphenol, 2-methyl-6-propylphenol, 2-ethyl-6-propylphenol, o-cresol, 2,3-dimethylphenol, 2,3-diethylphenol, 2,3-dipropylphenol, 2-methyl-3-ethylphenol, 2-methyl-3-propylphenol, 2-ethyl-3-methylphenol, 2-ethyl-3-propylphenol, 2-propyl-3-methyl-phenol, 2-propyl-3-ethylphenol, 2,3,6-trimethylphenol, 2,3,6-triethylphenol, 2,3,6-tripropylphenol, 2,6-dimethyl-3-ethylphenol and 2,6-dimethyl-3-propylphenol. Accordingly, examples of polyphenylene ether resins obtained by polycondensing these monocyclic phenols include homopolymers such as poly(2,6-dimethyl-1,4-phenylene)ether, poly(2,6-diethyl-1,4-phenylene)ether, poly(2,6-dipropyl-1,4-phenylene)ether, poly(2-methyl-6-ethyl-1,4phenylene)ether, poly(2-methyl-6-propyl-1,4-phenylene) ether and poly(2-ethyl-6-propyl-1,4-phenylene)ether, and copolymers such as 2,6-dimethylphenol/2,3,6-trimethylphenol copolymer, 2,6-dimethylphenol/2,3,6-triethylphenol copolymer, 2,6-diethylphenol/2,3,6-trimethylphenol copolymer and 2,6-dipropylphenol/2,3,6-trimethylphenol copolymer.

Of these, poly(2,6-dimethyl-1,4-phenylene)ether and 2,6-dimethylphenol/2,3,6-trimethylphenol copolymer are preferred.

Preferred as the aforesaid grafted polymer is a graft polymer obtained by grafting an aromatic vinyl compound represented by the following formula (II)

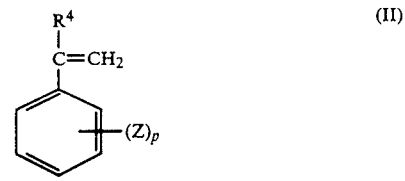

wherein $R^4$ represents a hydrogen atom or a lower alkyl group, Z represents a halogen atom or a lower alkyl group, and p is 0 or an integer of 1 to 3, to the polyphenylene ether homo- or co-polymer. The grafted polymer can be produced, for example, by the method described in Japanese Laid-Open Patent Publication No. 126,800/1975. Examples of the aromatic vinyl compound are styrene, alpha-methylstyrene, vinyltoluene, vinylxylene, ethyl styrene, n-propylstyrene, isopropylstyrene, chlorostyrene and bromostyrene.

Especially preferred grafted polymers are a graft polymer obtained by grafting styrene to poly(2,6-dimethyl-1,4-phenylene)ether and a graft polymer obtained by grafting styrene to 2,6-dimethylphenol/2,3,6-trimethylphenol copolymer.

The polyphenylene ether resins used in this invention may be a mixture of at least two of the above homopolymers and copolymers.

The linear aliphatic polyamide resins are polyamides from diamines and dicarboxylic acids one or both of which are aliphatic, and polyamides from aminocarboxylic acids or aliphatic lactams. Preferred diamines are those having 6 to 12 carbon atoms, and examples include hexamethylenediamine, decamethylenediamine, dodecamethylenediamine, 2,2,4-trimethylhexamethylenediamine, 1,4-bis(aminomethyl)cyclohexane, p-xylylenediamine and m-xylylenediamine.

The dicarboxylic acids are preferably those having 6 to 12 carbon atoms Examples include aliphatic, alicyclic and aromatic dicarboxylic acids such as adipic acid, sebacic acid, cyclohexanedicarboxylic acid, terephthalic acid and isophthalic acid.

Lactams which give polyamides by ring-opening polymerization are preferably those having 6 to 12 carbon atoms, and examples include epsilon-caprolactam and omega-dodecalactam. The aminocarboxylic acids are preferably those having 6 to 12 carbon atoms, such as 6-aminocarboxylic acid, 11-aminoundecanoic acid and 12-aminododecanoic acid.

66-nylon, 6-nylon and 6,10-nylon are especially preferably used as the aliphatic polyamides.

The aliphatic polyamide resins may be used singly or as a mixture of two or more.

At least one of the above-mentioned various resins may be used as the thermoplastic resin (A) in this invention. For example, a combination of the polyphenylene ether resin and the polystyrene resin is preferred as the resin mixture.

The thermoplastic resin (A) used in this invention has a melt index of preferably 5 to 50 g/10 min. and more preferably 20 to 50 g/10 min.

The component (B) of the composition of this invention consists of electrically conductive glass fibers. The conductive glass fibers are, for example, glass fibers to which an electrically conductive coating such as a metallic coating is applied. The conductive glass fibers are produced, for example, by applying a film of a metal such as copper, aluminum or nickel or a metal alloy to the glass fibers by, for example, electroless plating or vapor deposition.

The proportion of the conductive glass fibers (B) is 30 to 300 parts by weight per 100 parts by weight of the thermoplastic resin (A). If the proportion exceeds the specified upper limit, the ease of extruding the resulting composition is reduced, and if it is below the lower limit, no sufficient electromagnetic wave-shielding function can be obtained. The preferred proportion of the conductive glass fibers (B) is 100 to 200 parts by weight on the same basis.

The component (C) of the composition of this invention is carbon black. Examples of the carbon black are thermal black, channel black, acetylene black, Ketjen black and furnace black, and furnace black is especially preferred.

The proportion of the carbon black (C) is 5 to 40 parts by weight per 100 parts by weight of the thermoplastic resin (A). If the proportion exceeds the specified upper limit, the ease of extruding the resulting composition is reduced, and if it is below the lower limit, no sufficient electromagnetic wave-shielding function can be obtained. The preferred proportion of the carbon black (C) is 15 to 25 parts by weight on the same basis.

The component (D) constituting the composition of this invention is graphite. The graphite may be of natural or artificial origin and may be scale-like or lumpy. Natural scale-like graphite is preferred.

The proportion of the graphite (D) is 5 to 40 parts by weight per 100 parts by weight of the thermoplastic resin (A). If it exceeds the upper limit, the ease of extruding the resulting composition is reduced, and if it is below the lower limit, no sufficient electromagnetic wave shielding function can be obtained. The preferred proportion of the graphite (D) is 15 to 25 parts by weight on the same basis.

In addition to the components (A), (B), (C) and (D), the composition of this invention may contain at least one of stabilizers against deterioration by oxidation, heat, ultraviolet light, etc., agents for preventing such deterioration, a nucleating agent, a plasticizer, a fire retardant, an antistatic agent, a lubricant, etc.

The components constituting the composition of this invention may be mixed by various methods. For example, they may be melt-kneaded at a temperature 5° to 50° C. higher than the melting point or softening point of the thermoplastic resin using an ordinary vent-type extruder or a similar device. Investigations of the present inventors have shown that the composition comprising the components (A) to (D) exhibits a high electromagnetic wave-shielding effect over a broad frequency band region, for example from 10 MHz to 300 MHz, and has excellent mechanical strength.

The present inventors furthered their investigations, and have found that when a combination of a polyamide resin derived from xylylenediamine and 66-nylon is used as the thermoplastic resin, it is possible to impart the same properties as above especially advantageously.

Such an electromagnetic wave-shielding thermoplastic resin composition of this invention comprises (A) 100 parts by weight of a polyamide resin derived from xylylenediamine as a main diamine component and an alpha,omega-linear aliphatic dicarboxylic acid as a main dicarboxylic acid component, (A') 5 to 100 parts by weight of nylon 66, (B) 30 to 300 parts by weight of conductive glass fibers, (C) 5 to 40 parts by weight of carbon black, and (D) 5 to 40 parts by weight of graphite.

Examples of the polyamide resin (A) include polyamide resins (i.e., MX-nylon) produced by the polycondensation reaction of xylylenediamine composed mainly of m-xylylenediamine such as m-xylylenediamine itself or a mixture of 60% or more of m-xylylenediamine and 40% or less of p-xylylenediamine with an alpha,omega-linear aliphatic dicarboxylic acid having 6 to 12 carbon atoms. Specific examples of the dicarboxylic acid are adipic acid, sebacic acid, suberic acid, undecanedioic acid and dodecanedioic acid. Adipic acid is most suitable. The MX-nylons can have a relative viscosity, measured at 25° C. for a solution of 1g of the polymer in 100 ml of 98% sulfuric acid, of generally 1.7 to 2.9, preferably 1.9 to 2.4.

The preferred proportions of the components (A'), (B), (C) and (D) in the above composition are as follows:

| (A') nylon 66 | 10 to 20 parts by weight |
|---|---|
| (B) conductive glass fibers | 100 to 200 parts by weight |
| (C) carbon black | 15 to 25 parts by weight |
| (D) graphite | 15 to 25 parts by weight |

The nylon 66, conductive glass fibers, carbon black and graphite may be the same as those described hereinabove.

The following examples illustrate the present invention more specifically.

In these examples, all parts are by weight, and the various properties were measured by the following methods.
(1) Tensile strength: ASTM D638
(2) Tensile elongation: ASTM D638
(3) Tensile modulus: ASTM D638
(4) Flexural strength: ASTM D790
(5) Flexural modulus: ASTM D790
(6) Izod impact strength: ASTM D256
(7) Heat distortion temperature: ASTM D648
(8) Volume inherent resistivity: ASTM D257
(9) Electromagnetic shielding property: ADVANTEST method

EXAMPLE 1

One hundred parts of nylon 66, 106 parts of nickel-copper-nickel three layer-coated glass fibers having a fiber length of 3 to 6 mm and a specific resistance of $10^{-3}$ to $10^{-5}$ ohm-cm (EMITEC, made by Asahi Fiber Glass Co., Ltd.), 15 parts of natural scale-like graphite powder (Special CP; Japan Graphite Co., Ltd.) and 15 parts of highly electrically conducture furnace black (Vulcan XC-72, a product of Cabot Corporation) were melt-kneaded in a single screw vent-type extruder at a cylinder temperature of 270° C., and extruded into a strand. The extruded strand was cooled by a water bath, cut to pellets and dried to obtain a polyamide resin composition.

The pellets were injection-molded under the following conditions to obtain test pieces which were tested for various properties.
Resin temperature: 275° C.
Die temperature: 75° C.
Injection and pressure maintenance time: 5 seconds Cooling time: 20 seconds
Injection pressure: 500 to 600 kg/cm$^2$
The results are shown in Table 1.

EXAMPLES 2–6

Example 1 was repeated except that the types or the proportions of the components were changed as indicated in Table 1 (in Examples 4 to 6, the resin temperature at the time of injection molding was changed to 240° C).

The results are shown in Table 1.

EXAMPLES 8–10

Example 7 was repeated except that the types or the proportions of the components were changed as indicated in Table 2.

The results are shown in Table 2.

In Example 10, brominated polystyrene and antimony trioxide which are fire retardants were incorporated. Test pieces obtained from the resulting resin composition were subjected to a vertical burning test in accordance with UL standards. Both ⅛ inch and 1/16 inch test pieces were found to be acceptable in V-0.

TABLE 1

| Example | | 1 | 2 | 3 | 4 | 5 | 6 |
|---|---|---|---|---|---|---|---|
| Proportions (parts by weight) | Nylon 66 | 100 | 100 | 100 | — | — | — |
| | Nylon 6 | — | — | — | 100 | 100 | 100 |
| | Carbon black | 15 | 5 | 20 | 15 | 5 | 20 |
| | Graphite | 15 | 5 | 20 | 15 | 5 | 20 |
| | Conductive glass fiber | 106 | 30 | 150 | 106 | 30 | 150 |
| Mechanical properties | Tensile strength kg/cm$^2$ | 1030 | 963 | 1150 | 980 | 915 | 1090 |
| | Tensile elongation % | 1.10 | 0.94 | 1.41 | 1.75 | 3.30 | 2.30 |
| | Tensile modulus 10$^3$ kg/cm$^2$ | 133 | 122 | 132 | 117 | 107 | 119 |
| | Flexural strength kg/cm$^2$ | 1660 | 1390 | 1600 | 1680 | 1410 | 1580 |
| | Flexural modulus 10$^3$ kg/cm$^2$ | 107 | 81 | 127 | 106 | 81 | 116 |
| | Izod impact strength (⅛ inch notched) kg-cm/cm$^2$ | 5.1 | 3.8 | 4.3 | 5.5 | 3.1 | 4.0 |
| | Izod impact strength (⅛ inch unnotched) kg-cm/cm$^2$ | 50.2 | 16.2 | 30.0 | 60.0 | 18.5 | 20.5 |
| | Heat distortion temperature °C. | 250 | 250 | 250 | 205 | 205 | 208 |
| Electrical properties | Volume inherent resistivity Ω · cm | 2.4 | 45 | 0.83 | 3.6 | 21 | 0.39 |
| | Electromagnetic shielding property | | | | | | |
| | (electric field 30 MHz) db | 48 | — | — | 50 | — | — |
| | (electric field 300 MHz) db | 67 | — | — | 69 | — | — |
| | (magnetic field 30 MHz) db | 28 | — | — | 32 | — | — |
| | (magnetic field 300 MHz) db | 69 | — | — | 70 | — | — |

EXAMPLE 7

One hundred parts of poly(m-xylene adipamide) having an average molecular weight of 16,000 (abbreviated as "nylon MXD6" hereinafter), 13 parts of nylon 66, 120 parts of nickel-copper-nickel three layer-coated glass fibers (EMITEC, a product of Asahi Fiber Glass Co., Ltd.) having a fiber length of 3 to 6 mm and a specific resistance of 10$^{-3}$ to 10$^{-5}$ ohm-cm, 17 parts of natural scale-like graphite powder (Special CP, a product of Japan Graphite Co., Ltd.) and 17 parts of highly electrically conductive furnace black (Vulcan XC-72, a product of Cabot Corporation) were melt-kneaded in a single screw vent-type extruder at a cylinder temperature of 270° C., and extruded into a strand. The extruded strand was cooled by a water bath, cut to pellets and dried to obtain a polyamide resin composition.

The pellets were injection-molded under the following conditions to obtain test pieces which were tested for various properties.
Resin temperature: 260° C.
Die temperature: 130° C.
Injection and pressure maintenance time: 5 seconds
Cooling time: 20 seconds
Injection pressure: 500 to 600 kg/cm$^2$
The results are shown in Table 2.

TABLE 2

| Example | | 7 | 8 | 9 | 10 |
|---|---|---|---|---|---|
| Proportions (parts by weight) | Nylon MXD 6 | 100 | 100 | 100 | 100 |
| | Nylon 66 | 13 | 5 | 100 | 20 |
| | Carbon black | 17 | 5 | 40 | 13 |
| | Graphite | 17 | 5 | 40 | 39 |
| | Conductive glass fiber | 120 | 30 | 300 | 190 |
| | Brominated polystyrene | — | — | — | 38 |
| | Antimony trioxide | — | — | — | 19 |
| Mechanical properties | Tensile strength kg/cm$^2$ | 1090 | 1020 | 1100 | 890 |
| | Tensile elongation % | 1.06 | 0.97 | 1.41 | 0.80 |
| | Tensile modulus 10$^3$ kg/cm$^2$ | 149 | 137 | 113 | 180 |
| | Flexural strength kg/cm$^2$ | 1560 | 1310 | 1580 | 1320 |
| | Flexural modulus 10$^3$ kg/cm$^2$ | 146 | 111 | 111 | 167 |
| | Izod impact strength (⅛ inch notched) kg-cm/cm$^2$ | 4.7 | 3.0 | 4.5 | 4.5 |
| | Izod impact strength (⅛ inch unnotched) kg-cm/cm$^2$ | 21.5 | 19.3 | 20.5 | 18.5 |
| | Heat distortion temperature °C. | 210 | 203 | 210 | 209 |
| Electrical properties | Volume inherent resistivity Ω · cm | 0.29 | 4.0 | 0.40 | 0.38 |
| | Electromagnetic shielding property | | | | |
| | (electric field 30 MHz) db | 58 | 45 | 56 | 56 |

TABLE 2-continued

| Example | 7 | 8 | 9 | 10 |
|---|---|---|---|---|
| (electric field 300 MHz) db | 75 | 70 | 71 | 72 |
| (magnetic field 30 MHz) db | 36 | 30 | 33 | 33 |
| (magnetic field 300 MHz) db | 75 | 68 | 72 | 75 |

EXAMPLE 11

One hundred parts of polyphenylene ether resin (Iupiace AV-30 produced by Mitsubishi Gas Chemical Co., Inc.; to be referred to as PPE resin hereinafter), 106 parts of a nickel-copper-nickel three layer-coated glass fibers (EMITEC, a product of Asahi Fiber Glass Co., Ltd.) having a fiber length of 3 to 6 mm and a specific resistance of $10^{-3}$ to $10^{-5}$ ohm-cm, 15 parts of natural scale-like graphite powder (Special CP, a product of Japan Graphite Co., Ltd.) and 15 parts of highly electrically conductive furnace black (Vulcan XC-72, a product of Cabot Corporation) were melt-kneaded in a single screw vent-type extruder at a cylinder temperature of 300° C., and extruded into a strand. The extruded strand was cooled by a water bath, cut to pellets and dried to obtain a PPE resin composition.

The pellets were injection-molded under the following conditions to obtain test pieces which were tested for various properties.
Resin temperature: 270° C.
Die temperature: 80° C.
Injection and pressure maintenance time: 10 seconds
Cooling time: 25 seconds
Injection pressure: 900 to 1100 kg/cm²
The results are shown in Table 3.

EXAMPLES 12-13

Example 11 was repeated except that the proportions of the components were varied as shown in Table 3. The results are shown in Table 3.

TABLE 3

| Example | | 11 | 12 | 13 |
|---|---|---|---|---|
| Proportions (parts by weight) | PPE resin | 100 | 100 | 100 |
| | Carbon black | 15 | 5 | 20 |
| | Graphite | 15 | 5 | 20 |
| | Conductive glass fiber | 106 | 30 | 150 |
| Mechanical properties | Tensile strength kg/cm² | 525 | 498 | 547 |
| | Tensile elongation % | 0.83 | 1.20 | 0.77 |
| | Tensile modulus 10³ kg/cm² | 111 | 97 | 121 |
| | Flexural strength kg/cm² | 745 | 656 | 778 |
| | Flexural modulus 10³ kg/cm² | 85 | 64 | 99 |
| | Izod impact strength (⅛ inch notched) kg-cm/cm² | 2.6 | 3.1 | 2.4 |
| | Izod impact strength (⅛ inch unnotched) kg-cm/cm² | 11.8 | 10.1 | 12.7 |
| | Heat distortion temperature °C. | 102 | 95 | 111 |
| Electrical properties | Volume inherent resistivity Ω · cm | 3.9 × 10⁻¹ | above 10⁷ | 1.2 × 10⁻¹ |
| | Electromagnetic shielding property | | | |
| | (electric field 30 MHz) db | 52 | — | 53 |
| | (electric field 300 MHz) db | 67 | — | 68 |
| | (magnetic field 30 MHz) db | 34 | — | 37 |
| | (magnetic field 300 MHz) db | 73 | — | 72 |

EXAMPLE 14

One hundred parts of polybutylene terephthalate resin (TOUGH PET, a product of Mitsubishi Rayon Co., Ltd.; to be abbreviated as PBT resin hereinafter), 106 parts of nickel-copper-nickel three layer-coated glass fibers (EMITEC, a product of Asahi Fiber Glass Co., Ltd.) having a fiber length of 3 to 6 and a specific resistance of $10^{-3}$ to $10^{-5}$ ohm-cm, 15 parts of natural scale-like graphite powder (Special CP, a product of Japan Graphite Co., Ltd.) and 15 parts of highly electrically conductive furnace black (Vulcan XC-72, a product of Cabot Corporation) were melt-kneaded in a single screw vent-type extruder at a cylinder temperature of 230° C., and extruded into a strand. The extruded strand was cooled by a water bath, cut to pellets and dried to obtain a PBT resin composition.

The pellets were injection-molded under the following conditions to obtain test pieces which were tested for various properties.
Resin temperature: 250° C.
Die temperature: 80° C.
Injection and pressure maintenance time: 10 seconds
Cooling time: 20 seconds
Injection pressure: 800 to 1000 kg/cm²
The results are shown in Table 4.

EXAMPLES 15-16

Example 14 was repeated except that the proportions of the components were changed as shown in Table 4. The results are shown in Table 4.

TABLE 4

| Example | | 14 | 15 | 16 |
|---|---|---|---|---|
| Proportions (parts by weight) | PBT resin | 100 | 100 | 100 |
| | Carbon black | 15 | 5 | 20 |
| | Graphite | 15 | 5 | 20 |
| | Conductive glass fiber | 106 | 30 | 150 |
| Mechanical properties | Tensile strength kg/cm² | 628 | 595 | 655 |
| | Tensile elongation % | 0.89 | 1.28 | 0.82 |
| | Tensile modulus 10³ kg/cm² | 129 | 112 | 140 |
| | Flexural strength kg/cm² | 820 | 722 | 587 |
| | Flexural modulus 10³ kg/cm² | 93 | 70 | 108 |
| | Izod impact strength (⅛ inch notched) kg-cm/cm² | 3.0 | 3.6 | 2.8 |
| | Izod impact strength (⅛ inch unnotched) kg-cm/cm² | 17 | 14.5 | 18.2 |
| | Heat distortion temperature °C. | 183 | 171 | 194 |
| Electrical properties | Volume inherent resistivity Ω · cm | 3.5 × 10⁻¹ | above 10⁷ | 1.0 × 10⁻¹ |
| | Electromagnetic shielding property | | | |
| | (electric field 30 MHz) db | 58 | — | 62 |
| | (electric field 300 MHz) db | 76 | — | 75 |
| | (magnetic field 30 MHz) db | 33 | — | 39 |
| | (magnetic field 300 MHz) db | 77 | — | 77 |

EXAMPLE 17

One hundred parts of polystyrene resin (Idemitsu Styrol HF10, a product of Idemitsu Petrochemical Co., Ltd.), 106 parts of nickel-copper-nickel three layer-coated glass fibers (EMITEC, a product of Asahi Fiber Glass Co., Ltd.) having a fiber length of 3 to 6 and a specific resistance of $10^{-3}$ to $10^{-5}$ ohm-cm, 15 parts of natural scale-like graphite powder (Special CP, a product of Japan Graphite Co., Ltd.) and 15 parts of highly electrically conductive furnace black (Vulcan XC-72, a product of Cabot Corporation) were melt-kneaded in a single screw vent-type extruder at a cylinder temperature of 230° C., and extruded into a strand. The extruded strand was cooled by a water bath, cut to pellets and dried to obtain a PBT resin composition.

The pellets were injection-molded under the following conditions to obtain test pieces which were tested for various properties.
Resin temperature: 210° C.
Die temperature: 50° C.
Injection and pressure maintenance time: 10 seconds
Cooling time: 20 seconds
Injection pressure: 800 to 1000 kg/cm²
The results are shown in Table 5.

EXAMPLES 18-19

Example 17 was repeated except that the proportions of the components were changed as indicated in Table 5. The results are shown in Table 5.

TABLE 5

| Example | | 17 | 18 | 19 |
|---|---|---|---|---|
| Proportions (parts by weight) | Polystyrene resin | 100 | 100 | 100 |
| | Carbon black | 15 | 5 | 20 |
| | Graphite | 15 | 5 | 20 |
| | Conductive glass fiber | 106 | 30 | 150 |
| Mechanical properties | Tensile strength kg/cm² | 422 | 400 | 440 |
| | Tensile elongation % | 0.43 | 0.62 | 0.40 |
| | Tensile modulus 10³ kg/cm² | 138 | 120 | 150 |
| | Flexural strength kg/cm² | 670 | 590 | 700 |
| | Flexural modulus 10³ kg/cm² | 99 | 75 | 115 |
| | Izod impact strength (⅛ inch notched) kg-cm/cm² | 1.6 | 1.9 | 1.5 |
| | Izod impact strength (⅛ inch unnotched) kg-cm/cm² | 8.2 | 7.0 | 8.8 |
| | Heat distortion temperature °C. | 90 | 86 | 94 |
| Electrical properties | Volume inherent resistivity Ω·cm | 7.6 × 10⁻¹ | above 10⁷ | 2.2 × 10⁻¹ |
| | Electromagnetic shielding property | | | |
| | (electric field 30 MHz) db | 56 | — | 57 |
| | (electric field 300 MHz) db | 73 | — | 72 |
| | (magnetic field 30 MHz) db | 34 | — | 38 |
| | (magnetic field 300 MHz) db | 74 | — | 74 |

EXAMPLE 20

One hundred parts of ABS resin (38NP, a product of Japan Synthetic Rubber Co., Ltd.), 106 parts of nickel-copper-nickel three layer-coated glass fibers (EMITEC, a product of Asahi Fiber Glass Co., Ltd.) having a fiber length of 3 to 6 and a specific resistance of 10⁻³ to 10⁻⁵ ohm-cm, 15 parts of natural scale-like graphite powder (Special CP, a product of Japan Graphite Co., Ltd.) and 15 parts of highly electrically conductive furnace black (Vulcan XC-72, a product of Cabot Corporation) were melt-kneaded in a single screw vent-type extruder at a cylinder temperature of 250° C., and extruded into a strand. The extruded strand was cooled by a water bath, cut to pellets and dried to obtain a ABS resin composition.

The pellets were injection-molded under the following conditions to obtain test pieces which were tested for various properties.
Resin temperature: 230° C.
Die temperature: 50° C.
Injection and pressure maintenance time: 10 seconds
Cooling time: 20 seconds
Injection pressure: 800 to 1000 kg/cm²
The results are shown in Table 6.

EXAMPLES 21-22

Example 20 was repeated except that the proportions of the components were changed as indicated in Table 6. The results are shown in Table 6.

TABLE 6

| Example | | 20 | 21 | 22 |
|---|---|---|---|---|
| Proportions (parts by weight) | ABS resin | 100 | 100 | 100 |
| | Carbon black | 15 | 5 | 20 |
| | Graphite | 15 | 5 | 20 |
| | Conductive glass fiber | 106 | 30 | 150 |
| Mechanical properties | Tensile strength kg/cm² | 547 | 518 | 570 |
| | Tensile elongation % | 0.50 | 0.72 | 0.47 |
| | Tensile modulus 10³ kg/cm² | 128 | 111 | 140 |
| | Flexural strength kg/cm² | 790 | 700 | 825 |
| | Flexural modulus 10³ kg/cm² | 110 | 83 | 128 |
| | Izod impact strength (⅛ inch notched) kg-cm/cm² | 2.2 | 2.6 | 2.1 |
| | Izod impact strength (⅛ inch unnotched) kg-cm/cm² | 8.1 | 6.9 | 8.7 |
| | Heat distortion temperature °C. | 88 | 79 | 94 |
| Electrical properties | Volume inherent resistivity Ω·cm | 1.3 × 10⁻¹ | above 10⁷ | 1.0 × 10⁻¹ |
| | Electromagnetic shielding property | | | |
| | (electric field 30 MHz) db | 54 | — | 56 |
| | (electric field 300 MHz) db | 66 | — | 71 |
| | (magnetic field 30 MHz) db | 33 | — | 37 |
| | (magnetic field 300 MHz) db | 75 | — | 72 |

EXAMPLE 23

One hundred parts of polypropylene resin (Chisso Polypro K-1800, a product of Chisso Corporation), 106 parts of nickel-copper-nickel three layer-coated glass fibers (EMITEC, a product of Asahi Fiber Glass Co., Ltd.) having a fiber length of 3 to 6 and a specific resistance of $10^{-3}$ to $10^{-5}$ ohm-cm, 15 parts of natural scale-like graphite powder (Special CP, a product of Japan Graphite Co., Ltd.) and 15 parts of highly electrically conductive furnace black (Vulcan XC-72, a product of Cabot Corporation) were melt-kneaded in a single screw vent-type extruder at a cylinder temperature of 230° C., and extruded into a strand. The extruded strand was cooled by a water bath, cut to pellets and dried to obtain a PBT resin composition.

The pellets were injection-molded under the following conditions to obtain test pieces which were tested for various properties.
Resin temperature: 210° C.
Die temperature: 50° C.
Injection and pressure maintenance time: 10 seconds
Cooling time: 10 seconds
Injection pressure: 800 to 900 kg/cm²
The results are shown in Table 7.

EXAMPLES 24–25

Example 23 was repeated except that the proportions of the components were changed as indicated in Table 7. The results are shown in Table 7.

TABLE 7

| Example | | 23 | 24 | 25 |
|---|---|---|---|---|
| Proportions (parts by weight) | Polypropylene resin | 100 | 100 | 100 |
| | Carbon black | 15 | 5 | 20 |
| | Graphite | 15 | 5 | 20 |
| | Conductive glass fiber | 106 | 30 | 150 |
| Mechanical properties | Tensile strength kg/cm$^2$ | 305 | 289 | 318 |
| | Tensile elongation % | 1.10 | 1.59 | 1.02 |
| | Tensile modulus 10$^3$ kg/cm$^2$ | 84 | 73 | 91 |
| | Flexural strength kg/cm$^2$ | 460 | 405 | 481 |
| | Flexural modulus 10$^3$ kg/cm$^2$ | 62 | 47 | 72 |
| | Izod impact strength (¼ inch notched) kg-cm/cm$^2$ | 2.7 | 3.2 | 2.5 |
| | Izod impact strength (¼ inch unnotched) kg-cm/cm$^2$ | 12.0 | 10.2 | 12.9 |
| | Heat distortion temperature °C. | 107 | 83 | 117 |
| Electrical properties | Volume inherent resistivity Ω · cm | 1.9 × 10$^{-1}$ | above 10$^7$ | 1.1 × 10$^{-1}$ |
| | Electromagnetic shielding property | | | |
| | (electric field 30 MHz) db | 53 | — | 56 |
| | (electric field 300 MHz) db | 66 | — | 72 |
| | (magnetic field 30 MHz) db | 38 | — | 39 |
| | (magnetic field 300 MHz) db | 74 | — | 71 |

What is claimed is:

1. An electromagnetic wave-shielding thermoplastic resin composition comprising
   (A) 100 parts by weight of a thermoplastic resin selected from the group consisting of polypropylene resins, polystyrene resins, acrylonitrile/styrene/butadiene copolymer resin, polybutylene terephthalate resins, polyphenylene ether resins and linear aliphatic polyamide resins, wherein said linear aliphatic polyamides are polymers of monomers selected from the group consisting of combinations of diamines having 6 to 12 carbon atoms with dicarboxylic acids having 6 to 12 carbon atoms, lactams having 6 to 12 carbon atoms and aminocarboxylic acids having 6 to 12 carbon atoms,
   (B) 100 to 200 parts by weight of electrically conductive glass fibers,
   (C) 15 to 25 parts by weight of carbon black selected from the group consisting of thermal black channel black, acetylene black and furnace black, and
   (D) 15 to 25 parts by weight of natural scale-like graphite.

2. The composition of claim 1 wherein the polypropylene resins are selected from a homopolymer of propylene and copolymers of propylene and alpha-olefins having 2 to 8 carbon atoms.

3. The composition of claim 1 wherein the acrylonitrile/styrene/butadiene copolymer resin consists of 25 to 30% by weight of acrylonitrile units, 25 to 30% by weight of butadiene units and the balance being styrene units, provided that the total weight of these units is 100%.

4. The composition of claim 1 wherein the polybutylene terephthlate resin contain at least 60 mole % of butylene terephthalate units.

5. The composition of claim 1 wherein the polyphenylene ether resin is a homopolymer or a copolymer of a monocyclic phenol represented by the following formula

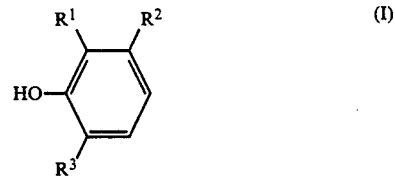

wherein R$^1$ represents an alkyl group having 1 to 3 carbon atoms, and R$^2$ and R$^3$, independently from each other, represent a hydrogen atom or an alkyl group having 1 to 3 carbon atoms.

6. The composition of claim 1 wherein the thermoplastic resin (A) has a melt index of 5 to 50 g/10 min.

7. The composition of claim 1 wherein the electrically conductive glass fibers (B) are glass fibers having an electrically conductive coating on their surface.

8. The composition of claim 1 wherein the polystyrene resins are selected from a homopolymer of styrene, random copolymers of styrene and another monomer which is alpha-methylstyrene or chlorostyrene, and high impact-resistant polystrene.

9. An electromagnetifc wave-shielding resin composition comprising
   (A) 100 parts by weight of a polyamide resin derived from xylylendediamine as a main diamine component and an alpha,omega-linear aliphatic dicarboxylic acid as a main dicarboxylic acid component.
   (A') 5 to 100 parts by weight of nylon 66,
   (B) 30 to 300 parts by weight of electrically conductive glass fibers having a metallic coating,
   (C) 5 to 40 parts by weight of carbon black, and
   (D)j 5 to 40 parts by weight of graphite.

* * * * *